US012671458B2

(12) United States Patent
Dinc et al.

(10) Patent No.: US 12,671,458 B2
(45) Date of Patent: Jun. 30, 2026

(54) MULTI-TERMINAL SWITCH

(71) Applicant: Texas Instruments Incorporated, Dallas, TX (US)

(72) Inventors: Tolga Dinc, Dallas, TX (US); Sachin Kalia, Dallas, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 408 days.

(21) Appl. No.: 18/072,667

(22) Filed: Nov. 30, 2022

(65) Prior Publication Data

US 2024/0178877 A1 May 30, 2024

(51) Int. Cl.
| | |
|---|---|
| *H04B 1/00* | (2006.01) |
| *H03K 17/687* | (2006.01) |
| *H04B 1/44* | (2006.01) |

(52) U.S. Cl.
CPC ........... *H04B 1/44* (2013.01); *H03K 17/6871* (2013.01)

(58) Field of Classification Search
CPC .............................. H04B 1/44; H03K 17/6871
See application file for complete search history.

(56) References Cited

U.S. PATENT DOCUMENTS

| | | | | |
|---|---|---|---|---|
| 8,279,018 | B1 * | 10/2012 | Song ...................... | H04B 1/581 |
| | | | | 333/132 |
| 10,581,389 | B1 * | 3/2020 | Balteanu ............... | H03F 1/0277 |
| 11,533,075 | B1 * | 12/2022 | Yu ............................ | H03F 3/72 |

| | | | | |
|---|---|---|---|---|
| 11,757,486 | B2 * | 9/2023 | Hur ...................... | H04B 1/0458 |
| | | | | 370/276 |
| 2017/0237466 | A1 * | 8/2017 | Carr ........................ | H02J 50/12 |
| | | | | 455/41.1 |
| 2019/0190560 | A1 * | 6/2019 | Reja ......................... | H04B 1/40 |
| 2020/0106367 | A1 * | 4/2020 | Bendani ............ | H02M 3/33576 |
| 2020/0204167 | A1 * | 6/2020 | Chakraborty .......... | H03K 5/131 |
| 2020/0343935 | A1 * | 10/2020 | Hur ...................... | H04B 1/0458 |
| 2022/0158343 | A1 * | 5/2022 | Hassan .................. | H01Q 3/247 |
| 2022/0231642 | A1 * | 7/2022 | Kao ........................... | H03F 3/72 |

(Continued)

OTHER PUBLICATIONS

Song et al, "A high-power, low-loss W-band SPDT switch using SiGe PIN diodes," 2014 IEEE Radio Frequency Integrated Circuits Symposium, 2014, pp. 195-198, doi: 10.1109/RFIC.2014.6851695. https://ieeexplore.ieee.org/stamp/stamp.jsp?tp=&arnumber=6851695.

*Primary Examiner* — Md K Talukder
(74) *Attorney, Agent, or Firm* — Zhenhai Fu; Frank D. Cimino

(57) ABSTRACT

In described examples, a multi-terminal switch includes first and second switches, and first, second, and third inductors. The first switch and first inductor are coupled between first terminals, the second switch and second inductor are coupled between second terminals, and the third inductor is coupled between third terminals. In a first mode, the first switch is opened and the second switch is closed. Opening the first switch and closing the second switch enables a first connection between the first terminals and the third terminals via a first magnetic coupling between the first and third inductors. In a second mode, the first switch is closed and the second switch is opened. Closing the first switch and opening the second switch enables a second connection between the second terminals and the third terminals via a second magnetic coupling between the second and third inductors.

21 Claims, 9 Drawing Sheets

(56)                    References Cited

U.S. PATENT DOCUMENTS

| | | | | |
|---|---|---|---|---|
| 2023/0327698 A1 * | 10/2023 | Lee | ......................... | H04B 1/44 |
| | | | | 455/78 |
| 2024/0047126 A1 * | 2/2024 | Jin | ................... | H02M 3/33576 |
| 2024/0080062 A1 * | 3/2024 | Wang | ...................... | H04B 1/44 |
| 2024/0178877 A1 * | 5/2024 | Dinc | ...................... | H04B 1/44 |

* cited by examiner

MULTI-TERMINAL SWITCH

BACKGROUND

Switches can be formed from a variety of components, in a variety of geometries, for a variety of applications. Transistors may function as on/off switches, with an on/off state dependent on whether a gate-source voltage of the transistor exceeding a threshold magnitude, and one or more transistors may be used to form a switch in an integrated circuit. Multiple transistors in series or parallel configuration can be used to form a switch if, for example, a wider on/off voltage swing is required than can be achieved by a single transistor within device area and process constraints.

SUMMARY

In described examples, a multi-terminal switch includes first and second switches, and first, second, and third inductors. The first switch and first inductor are coupled between first terminals, the second switch and second inductor are coupled between second terminals, and the third inductor is coupled between third terminals. In a first mode, the first switch is opened and the second switch is closed. Opening the first switch and closing the second switch enables a first connection between the first terminals and the third terminals via a first magnetic coupling between the first and third inductors. In a second mode, the first switch is closed and the second switch is opened. Closing the first switch and opening the second switch enables a second connection between the second terminals and the third terminals via a second magnetic coupling between the second and third inductors.

BRIEF DESCRIPTION OF THE DRAWINGS

The same reference numbers or other reference designators are used in the drawings to designate the same or similar (structurally and/or functionally) features.

DETAILED DESCRIPTION

Figure 1:
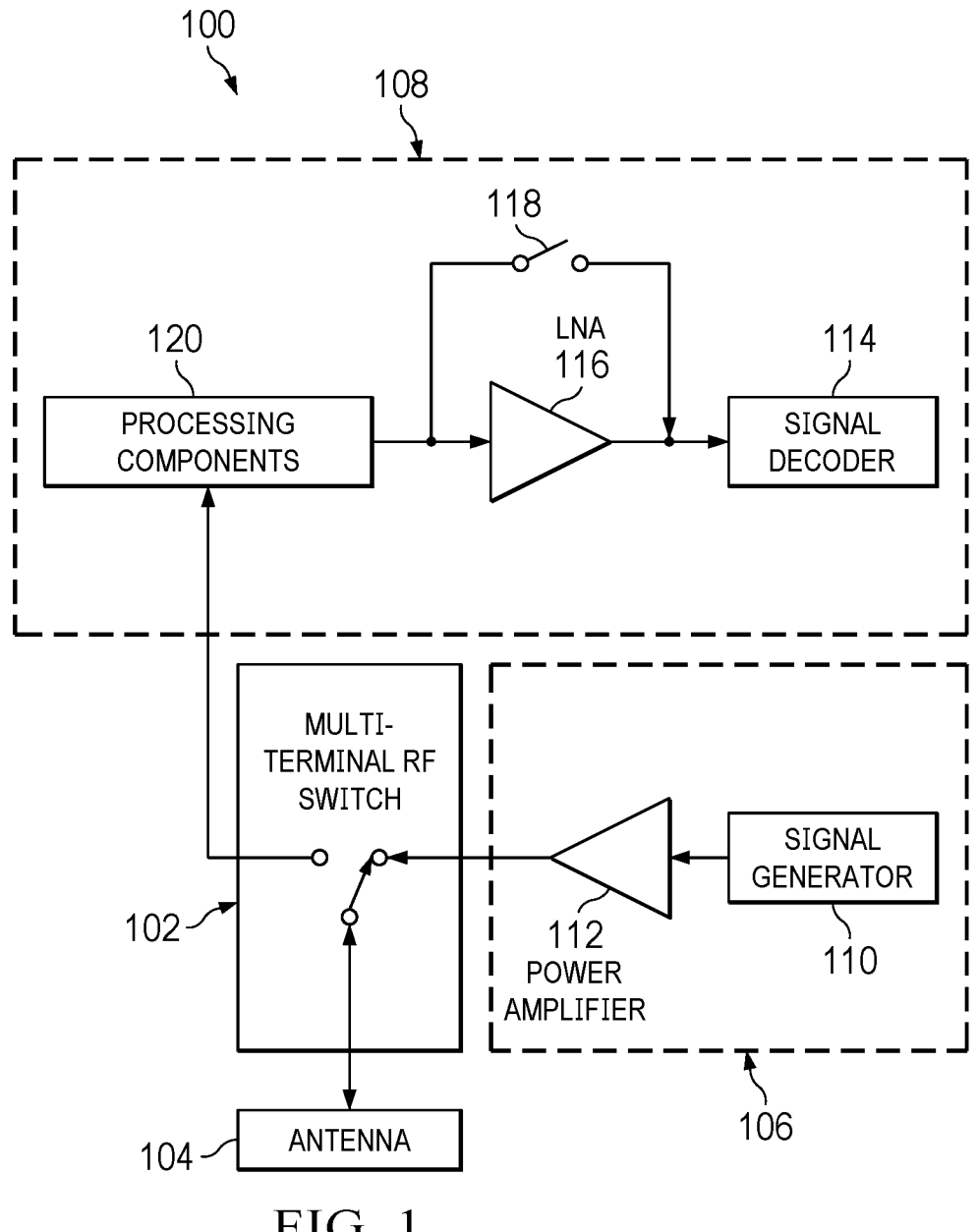
FIG. 1 is a schematic of a transceiver including an example multi-terminal switch.

FIG. 1 is a schematic of a transceiver 100 including an example multi-terminal switch 102. In some examples, multi-terminal switch 102 can be a single pole, double throw (SPDT) switch for radio frequency (RF) applications. The transceiver 100 includes an antenna 104, the multi-terminal switch 102, a transmitter side 106, and a receiver side 108. The transmitter side 106 includes a signal generator 110 and a power amplifier 112. The receiver side 108 includes a signal decoder 114, a low noise amplifier (LNA) 116, a switch 118, and other processing components 120, such as a filter. In some examples, processing components 120 are fabricated on a same die as the rest of the transceiver 100, or are connected to a printed circuit board (PCB) and are connected to the transceiver 100 by traces on the PCB.

The antenna 104, the transmitter side 106, and the receiver side 108 can each be coupled to a respective signal terminal of the multi-terminal switch 102. Depending on a state or an operation mode, the multi-terminal switch 102 can connect between the antenna 104 and the transmitter side 106, or connect between the antenna 104 and the receiver side 108. The signal generator 110 generates a signal to be transmitted, which it provides to the power amplifier 112. The power amplifier 112 outputs the signal to a signal terminal of the multi-terminal switch 102. If the multi-terminal switch 102 is in a state to connect between the antenna 104 and the transmitter side 106, the multi-terminal switch 102 can forward the signal from the power amplifier 112 to the antenna 104.

Also, if the multi-terminal switch 102 is in a state to connect between the antenna 104 and the receiver side 108, the multi-terminal switch 102 can forward a received signal from antenna 104 to the receiver side 108. The processing components 120 can perform initial processing on the received signal. The processing components 120 output the initially processed received signal to the LNA 116 if the switch 118 is open. The LNA 116 outputs an amplified received signal to the signal decoder 114. If the switch 118 is closed, the LNA 116 can be bypassed, and the processing components 120 can provide the received signal to the signal decoder 114.

The multi-terminal switch 102 can connect between the antenna 104 and the transmitter side 106 to enable the transceiver 100 to transmit a signal to antenna 104 for transmission. Alternatively, the multi-terminal switch 102 can connect the antenna 104 to the receiver side 108 to enable the transceiver 100 to receive a signal for processing by the signal decoder 114. In some examples, the transceiver 100 is configured to transmit and receive signals at frequencies within a range between 2.4 gigaHertz (GHz) and 7 GHz, or in a band spanning frequencies less than 1 GHz.

One performance metric of a circuit (e.g., an amplifier) is the power gain, which measures a ratio between output power and input power of the circuit. A circuit may have a linear input power range, in which the circuit provides a constant power gain. As the input power exceeds the linear input power range, the circuit may become saturated, and the power gain may decrease with the input power. The 1 decibel (dB) compression point (P1 dB) can refer to the input (or output) power level at which the power gain decreases one dB from its constant value. At an input power level above the P1 dB of a circuit, the circuit may operate as a non-linear device, producing distortion, harmonics, and intermodulation products. P1 dB can be measured in decibel-milliwatts (dBm), which is a unit used to express a power level in decibels with reference to one milliwatt (mW), that is, for x mW, [log(x mW)]*10=x dBm. For example, zero dBm equals one mW, ten dBm equals ten mW, and 20 dBm equals 100 mW.

In some examples, such as in certain high frequency systems, transceiver systems are sensitive to insertion loss and to non-linearity. Insertion loss can be the loss of signal power resulting from insertion of a device in a transmission line. Linearity can be related to a difference between the error vector magnitude (EVM) of signal at an input of a device, and the EVM of the signal at the output of the device.

An error vector is a vector in the I-Q plane between an ideal constellation point of a symbol in a signal, and the actual point received by a receiver. EVM is the root mean square (RMS) average amplitude of the error vector, normalized to the ideal signal amplitude. Accordingly, the higher the linearity of the switch, the lower the EVM of a switch across a frequency range and power range of connected components. In some examples, such as in the example of FIG. 1, multi-terminal switch 102 can have a low output EVM up to the P1 dB of a connected transmitter side 106.

A figure of merit (FoM) of a switch can be a product of on resistance and off capacitance, expressed as Ron×Coff or RonCoff. The switch on resistance (Ron) is along the conductive path between the switch's terminals while the switch is turned on (closed). The switch off capacitance (Coff) is the capacitance between its terminals while the switch is turned off (open). Ideally, a switch having an on state provides zero resistance, and a switch having an off state provides zero capacitance. Also, the higher the Ron-Coff of a switch, the greater the insertion loss of and the nonlinearities introduced by the switch.

Figure 2:
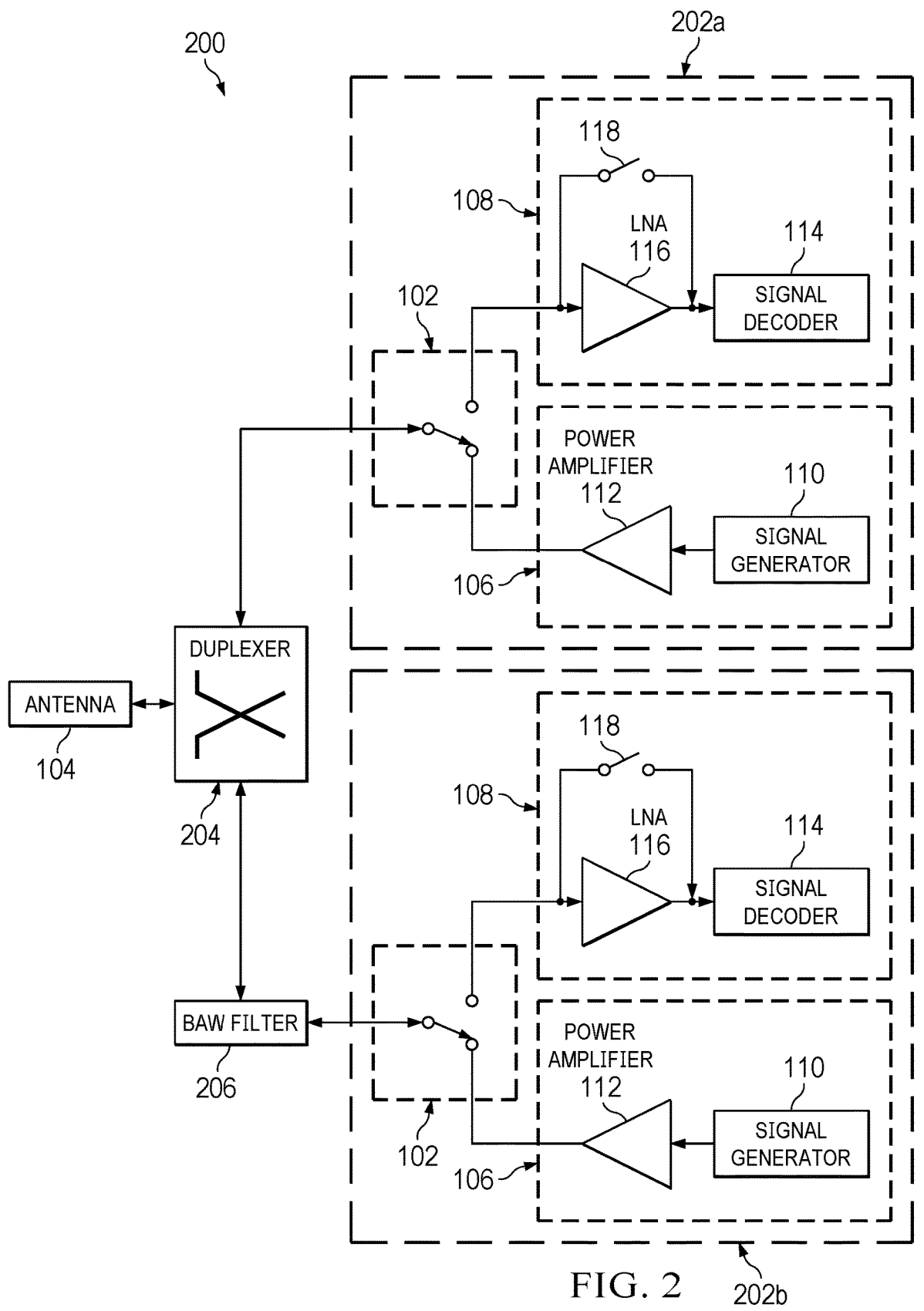
FIG. 2 is a schematic of a WiFi front-end module including an example multi-terminal switch.

FIG. 2 is a schematic of a WiFi front-end module (FEM) 200 including the multi-terminal switches 102. The WiFi FEM 200 can include two transceiver units 202a and 202b (collectively, transceiver units 202) configured to operate in two different frequency bands. The WiFi FEM 200 includes an antenna 104, a duplexer 204, and a bulk acoustic wave (BAW) filter 206. Each of the transceiver units 202a, 202b, includes a multi-terminal switch 102, a transmitter side 106, and a receiver side 108.

In some examples, the first transceiver unit 202a and the second transceiver unit 202b are configured to process signals having different frequency ranges. The first transceiver unit 202a can be configured to process signals in a frequency band around 2.4 GHz (such as a standards-defined 2.4 GHz frequency band), and the second transceiver unit 202b can be configured to process signals in a frequency band of 5 GHz to 7 GHz. The 2.4 GHz WiFi band is adjacent to certain Long-Term Evolution (LTE) bands. The BAW filter 206 provides a sharp roll-off, suppressing leakage into nearby LTE bands. The FEM 200 includes a multi-terminal switch 102 that can be configured, in frequency bands corresponding to the first transceiver unit 202a or the second transceiver unit 202b of this example, to have relatively high linearity and relatively low insertion loss that is independent of input power, as further described with respect to FIGS. 3 and 4.

Figure 3:
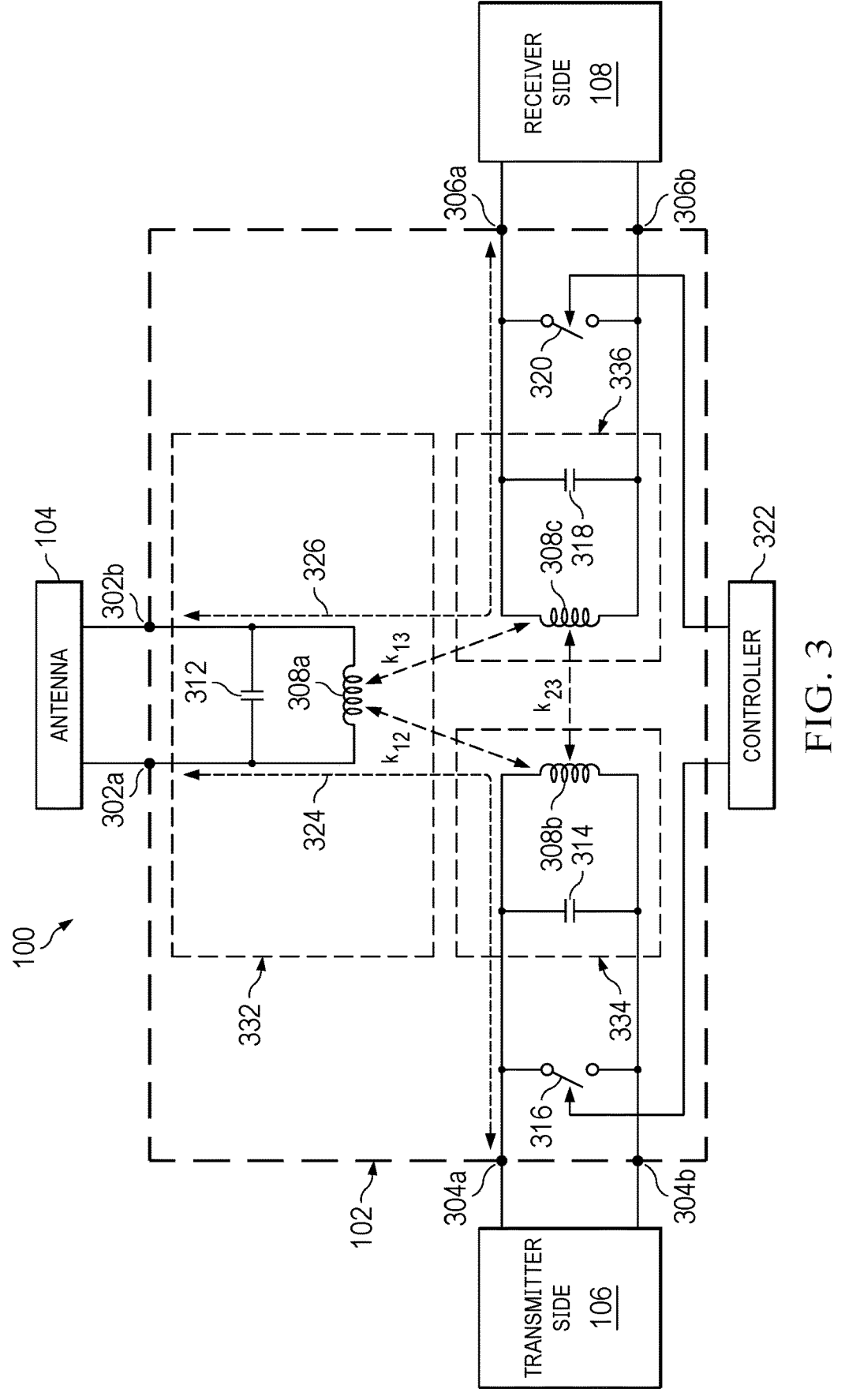
FIG. 3 is a schematic of example components of the multi-terminal switch of FIG. 1.

FIG. 3 is a schematic illustrating example internal components of the multi-terminal switch 102 of FIGS. 1 and 2. FIG. 3 illustrates the internal components of the multi-terminal switch 102 along with the antenna 104, the transmitter side 106, and the receiver side 108 of the transceiver 100. Referring to FIG. 3, the multi-terminal switch 102 includes terminals 302a, 302b, 304a, 304b, 306a, and 306b. The multi-terminal switch 102 also includes an inductor 308a, an inductor 308b, an inductor 308c, a switch 316, and a switch 320. Each inductor can include a coil or a metal stub fabricated in a stacked configuration where the three inductors are formed in three different metal layers, or in a same layer using a laterally coupled or interwound topology. The inductors can be in a same die or in different dies. The inductors can be within a same package or within different packages. The inductors can also be on a same PCB or on different PCBs. The inductor 308a is coupled between the terminals 302a and 302b. The inductor 308b is coupled between the terminals 304a and 304b. The inductor 308c is coupled between the terminals 306a and 306b. Each of the inductors 308a, 308b, and 308c can include a coil or a strip line. In some examples, the inductors 308a, 308b, and 308c can be part of a transformer, such as a multiple winding transformer.

Also, the switch 316 is also coupled between the terminals 302a and 302b. The switch 320 is also coupled between the terminals 306a and 306b. Each of the switches 316 and 320 can include one or more transistors, and each switch has a control terminal. The state of each switch (e.g., open or close) can be set by a state (e.g., a voltage level) of the control terminal. Transceiver 100 may include a controller 322 having control outputs coupled to the control terminals of switches 316 and 320 to set the states of the switches. The inductors 308a, 308b, and 308c and the switches 316 and 320 of the multi-terminal switch 102 can form a three-port switch network. In an example where the multi-terminal switch 102 is an SPDT switch, the terminals 302a and 302b and the inductor 308a can be part of a pole, the terminals 304a and 304b, the inductor 308b, and the switch 316 can be part of a first throw, and the terminals 306a and 306b, the inductor 308c, and the switch 320 can be part of a second throw.

In some examples, the terminal 302a can be coupled to a first input/output (I/O) terminal of the antenna 104, and the terminal 302b can be coupled to a second I/O terminal of the antenna 104. In some examples where the antenna 104 has single-ended I/O, the first I/O terminal of the antenna 104 receives signals for transmission and outputs received signals, and the second I/O terminal of the antenna 104 is connected to ground. In some examples where the antenna 104 provides differential output or accepts differential input, the first and second I/O terminals of the antenna 104 can output and receive opposite polarity signals via the terminals 302a and 302b.

Also, the terminal 304a can be coupled to a first output of the transmitter side 106, and the terminal 304b can be coupled to a second output of the transmitter side 106. In some examples where the transmitter side 106 has a single-ended output, the first output of the transmitter side 106 outputs signals for transmission, and the second output of the transmitter side 106 is connected to ground. In some examples where the transmitter side 106 provides differential output, the first and second outputs of the transmitter side 106 can provide opposite polarity signals via the terminals 304a and 304b.

Further, the terminal 306a can be coupled to a first input of the receiver side 108, and the terminal 306b can be coupled to a second input of the receiver side 108. In some examples where the antenna 104 has a single-ended output, the first input of the receiver side 108 receives signals for processing, and the second input of the receiver side 108 is connected to ground. In some examples, such as examples in which the receiver side 108 receives differential input, the first and second inputs of the receiver side 108 receive positive and negative polarity signals via the terminals 306a and 306b.

Figure 8:
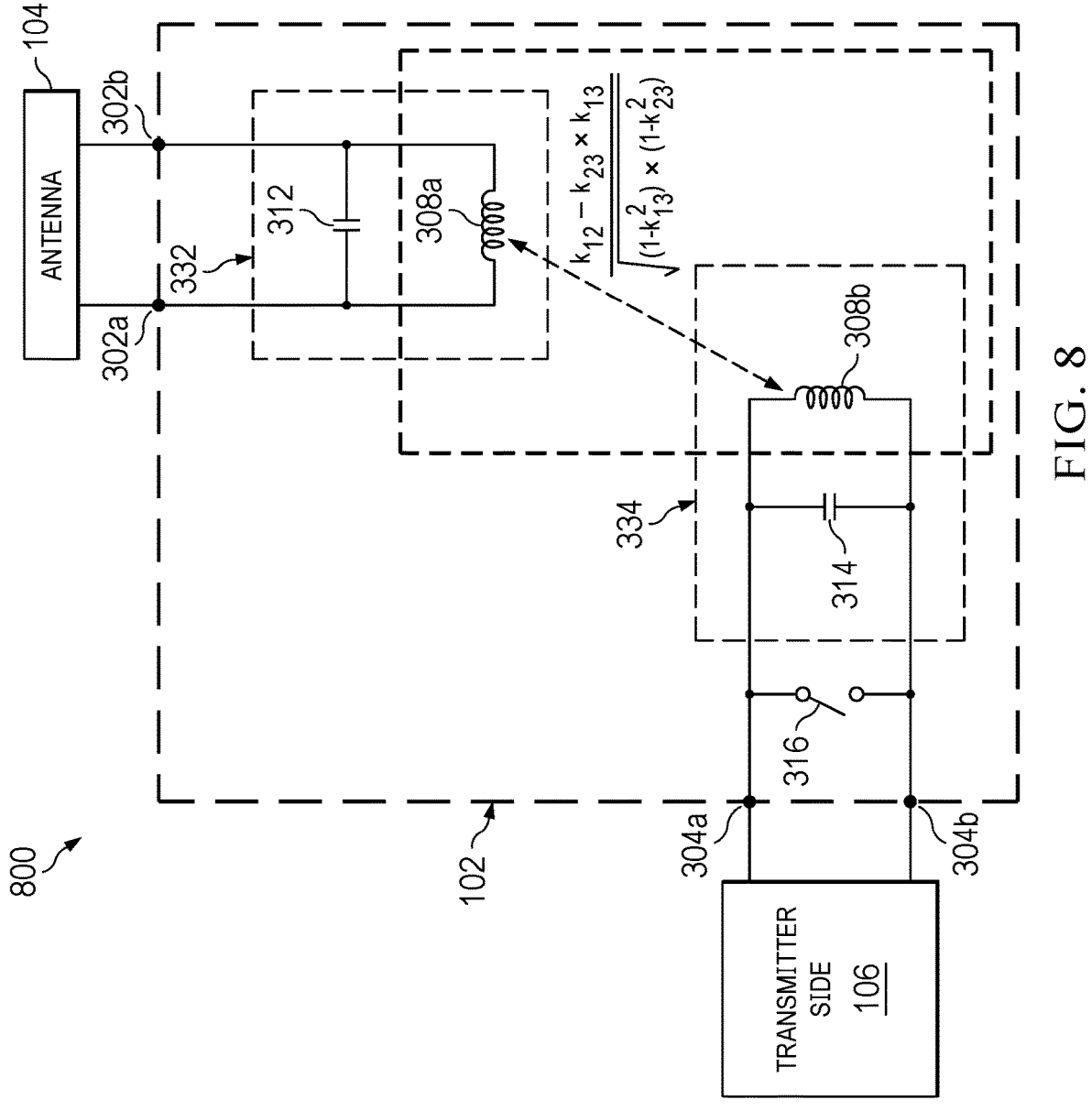
FIG. 8 is a schematic of a circuit model of an example multi-terminal switch.

The controller 322 can provide control signals to the control terminals of switches 316 and 320 to control their states, which can enable or disable a respective connection between the antenna 104 and each of the transmitter side 106 and the receiver side 108. Specifically, in a first operation mode, the controller 322 can open the switch 316 and close the switch 320. Because of the opening of the switch 316 and the closing of the switch 320, a connection 324 between the terminals 304a/b and the terminals 302a/b (and between the antenna 104 and the transmitter side 106) is enabled. Also, a connection 326 between the terminals 304a/b and the terminals 302*a/b* (and between the antenna 104 and the receiver side 108) is disabled. This enables transmission of a first signal between the terminals 304*a/b* and the terminals 302*a/b* via a magnetic coupling between inductor 308*a* and 308*b*. The magnetic coupling coefficient between the inductors 308*a* and 308*b* is labelled $k_{12}$ in FIG. 3. The closing of the switch 320 can reduce the coupling of the first signal into the receiver side 108 via a magnetic coupling between the inductors 308*a* and 308*b*. The magnetic coupling coefficient between the inductors 308*b* and 308*c* is labelled $k_{23}$ in FIG. 3. An equivalent circuit model of the connection 324 between the terminals 302*a/b* and 304*a/b* that accounts for the coupling of the first signal into the receiver side 108 due to magnetic coupling between the inductors 308*b* and 308*c*, is illustrated in FIG. 8.

Also, in a second operation mode, the controller 322 can close the switch 316 and open the switch 320. The closing of the switch 316 and the opening of the switch 320 can disable the connection 324 between the terminals 304*a/b* and the terminals 302*a/b*, and enable the connection 326 between the terminals 306*a/b* and the terminals 302*a/b*. This enables transmission of a second signal between the terminals 306*a/b* and the terminals 302*a/b* via a magnetic coupling between the inductors 308*a* and 308*c*. The magnetic coupling coefficient between the inductors 308*a* and 308*c* is labelled $k_{13}$ in FIG. 3. The closing of the switch 316 can reduce the coupling of the second signal into the transmitter side 108 via a magnetic coupling between the inductors 308*b* and 308*c*.

In some examples, the multi-terminal switch 102 may include a capacitor 312, a capacitor 314, and a capacitor 318. In some examples, each of the capacitors 312, 314, and 318 can include a tunable element (e.g., a varactor) so that their respective capacitances can be adjusted/tuned. The capacitor 312 can be coupled between the terminals 302*a* and 302*b* and in parallel with the inductor 308*a* as a shunt capacitor. The capacitor 312 and the inductor 308*a* can form a resonator 332 having a resonant frequency. In some examples, the parasitic capacitance of the switch 316 alone (e.g., for a relatively high resonant frequency), or in combination with the capacitor 312, can also form the resonator 332 with the inductor 308*a*. The capacitor 314 can be coupled between the terminals 304*a* and 304*b* and in parallel with the inductor 308*b* as a shunt capacitor. The resonator 334 can be enabled by the opening of the switch 316 and can be disabled by the closing of the switch 316. With the switch 316 opened (and the switch 320 closed) and the connection 324 between the terminals 302*a/b* and 304*a/b* enabled, the transmitted power of the first signal (via the magnetic coupling between the inductors 308*a* and 308*b*) can be increased or maximized (or the loss be reduced or minimized) by the resonators 332 and 334, if the first signal is at the resonant frequency of the resonators 332 and 334. Also, if the switch 316 is closed, the resonator 334 is shorted, the magnetic energy in the coil 308*a* is mostly or entirely transferred to the coil 308*c*, and the connection 324 is disabled.

Further, the capacitor 318 can be coupled between the terminals 306*a* and 306*b* and in parallel with the inductor 308*c* as a shunt capacitor. The capacitor 318 and the inductor 308*c* can form a resonator 336 having a resonant frequency. In some examples, the parasitic capacitance of the switch 320 alone (e.g., for a relatively high resonant frequency), or in combination with the capacitor 318, can also form the resonator 336 with the inductor 308*c*. The resonator 336 can be enabled by the opening of the switch 320 and can be disabled by the closing of the switch 320. With the switch 320 opened (and switch 316 closed) and the connection 326 between terminals 302*a/b* and 306*a/b* enabled, the transmitted power of the second signal (via the magnetic coupling between inductors 308*a* and 308*c*) can be increased or maximized (or the loss be reduced or minimized) by the resonators 332 and 336, if the second signal is at the resonant frequency of the resonators 332 and 336. Also, if the switch 320 is closed, the resonator 336 is shorted, the magnetic energy in the coil 308*a* is mostly or entirely transferred to the coil 308*b*, and the connection 326 is disabled.

Each of the connections 324 and 326 can be represented by a two-port switch network, which can be equivalently modeled as a doubly-tuned transformer. A doubly-tuned transformer is a fourth order network that can be designed to provide a selected band pass response. Specifically, the capacitor 312 can have a capacitance C1, the capacitor 314 can have a capacitance C2, and the capacitor 318 can have a capacitance C3. Also, the inductor 308*a* can have an inductance L1, the inductor 308*b* can have an inductance L2, and the inductor 308*c* can have an inductance L3. The values of L1, L2, L3, C1, C2, C3, and the magnetic coupling coefficients $k_{12}$, $k_{13}$, and $k_{23}$, can be configured so the enabled connection of multi-terminal switch 102 (e.g., between terminals 302*a/b* and 304*a/b*, and between terminals 302*a/b* and 306*a/b*) can have an improved bandpass response (e.g., reduced loss, improved transmitted power, etc.) within the operation frequency range of the circuits coupled to the terminals. For example, with respect to the transceiver 100, the inductances, capacitances, and magnetic coupling coefficients can be configured so that the enabled connection of the multi-terminal switch 102 can have an improved bandpass response within the operation frequency ranges of the transmitter side 106 and the receiver side 108. Band pass response of the multi-terminal switch 102 is further described with respect to FIG. 5.

The example multi-terminal switch 102 of FIG. 3 can provide improved performance. As explained above, a figure of merit (FoM) used for switches is a product of on resistance and off capacitance, expressed as Ron×Coff or Ron-Coff. For improved FoM, both the resistance of the enabled connection (on switch), and the capacitance of the disabled connection (off switch) added to the enabled connection, can be reduced. The multi-terminal switch 102 can provide reduced on resistance (Ron) and off capacitance (Coff).

Specifically, to enable the connection 324 between terminals 302*a/b* and the terminals 304*a/b*, the switch 316 can be opened and the switch 320 can be closed. Because the switch 316 is opened (disabled), the effect of switch 316 on the on resistance of the enabled connection is reduced (or minimized). Also, while switch 320 is closed (enabled), switch 320 is not part of the enabled connection 324 between terminals 302*a/b* and 304*a/b*. Accordingly, the on resistance of switch 320 has reduced (or minimum) effect on the on resistance of the enabled connection. Accordingly, the on resistance (Ron) of the enabled connection between terminals 302*a/b* and 304*a/b* can be reduced, or at least not distorted/increased by the switches 316 and 320, which can improve the linearity of the switch 102. Further, the disabled switch 316 may contribute Coff to the enabled connection 324, but the parasitic capacitances of the switch 316 can be small. Also, as described before, the parasitic capacitance of the switch 316 can be combined with the inductor 308*b* to provide the resonator 334.

Also, to enable the connection 326 between the terminals 302*a/b* and the terminals 306*a/b*, the switch 316 can be closed and the switch 320 can be opened. Because the switch 320 is opened (off), the effect of the switch 320 on the on resistance of the enabled connection 326 is reduced (or minimized). Also, while the switch 316 is closed (on), the switch 316 is not part of the enabled connection. Accordingly, the on resistance of the switch 316 has reduced (or minimum) effect on the on resistance of the enabled connection 326 between the terminals 302a/b and 306a/b. Accordingly, the on resistance of the enabled connection 326 between the terminals 302a/b and 306a/b can be improved, or at least not distorted/increased by the switches 316 and 318. Also, the disabled switch 320 also contributes capacitance to the enabled connection 326, but the parasitic capacitances of the switch 320 can be small and, as described above, can be combined with the inductor 308c to provide the resonator 336.

As noted above, the switches 316 and 320 contribute minimum RonCoffs. This allows the switches 316 and 320 to be fabricated using relatively inexpensive processes and components, such as relatively large metal-oxide-semiconductor field-effect transistors (MOSFETS) fabricated using complementary metal-oxide semiconductor (CMOS). Also, the Coff of the switch 316 can combine with the inductor 308b to provide the resonator 332, and the Coff of the switch 320 can combine with the inductor 308c to provide the resonator 334. Accordingly, in some examples, the Coff of the switch 316 can replace the capacitor 314, and the Coff of the switch 320 can replace the capacitor 318. In some examples, the Coff of the switch 316 can combine with the capacitor 314 to provide the total capacitance of the resonator 332, and the Coff of the switch 320 can combine with the capacitor 318 to provide the total capacitance of the resonator 334. This allows the shrinking of the sizes of the capacitors 314 and 318. Accordingly, the sizes of the switches 316 and 320 can be configured to provide the requisite off-capacitance to provide a band pass response over a particular frequency range.

Figure 4:
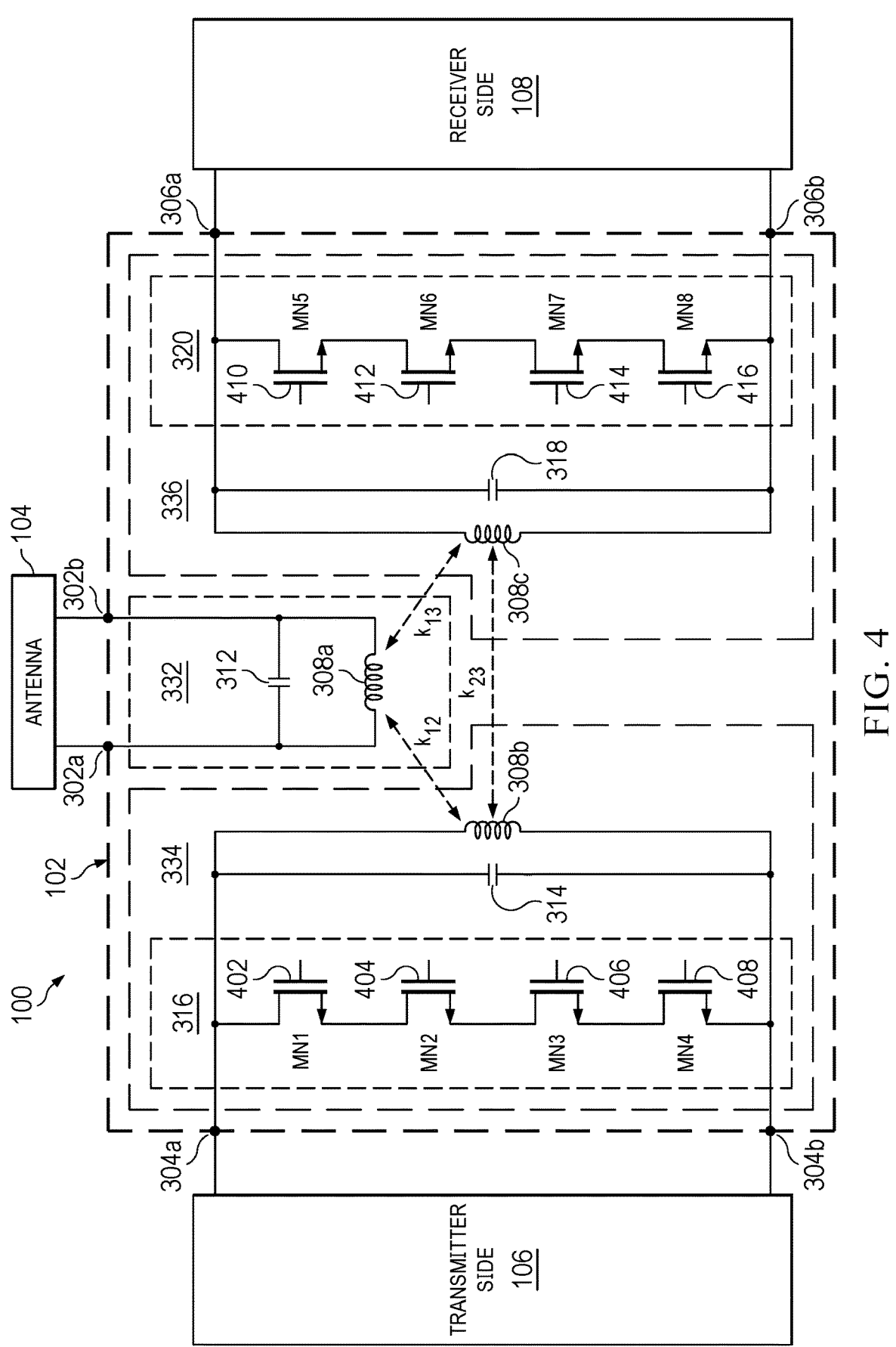
FIG. 4 is a schematic of example components of the multi-terminal switch of FIG. 1.

FIG. 4 is a schematic illustrating example internal components of the multi-terminal switch 102. Referring to FIG. 4, each of the switches 316 and 320 can include transistors, such as FETs (e.g., MOSFETs). The switch 316 can include stacked n-channel FETs (NFETs) 402, 404, 406, and 408 (labelled MN1, MN2, MN3, and MN4 respectively in FIG. 4), with the source/drains (current terminals) of each of these transistors coupled in series, and the gates (control terminals) of the transistors coupled together. The switch 320 can include stacked NFETs 410, 412, 414, and 416 (labelled MN5, MN6, MN7, and MN8 respectively in FIG. 4), with the source/drains (current terminals) of each of these transistors coupled in series. The gates (control terminals) of these transistors are coupled together. For brevity, the controller 322 is not shown in FIG. 4.

In some examples, the first output of the controller 322 is coupled to the gates of NFETs 402, 404, 406, 408; and the second output of the controller 322 is coupled to the gates of NFETs 410, 412, 414, and 416. As explained above, the parasitic capacitances of the NFETs of switches 316 and 320 add minimum/reduced Coff to the enabled connection, which improves the FoM of the multi-terminal switch 102. Also the parasitic capacitances can be combined with other capacitors (314 or 318) and inductors (308b or 308c) to provide the respective resonators to improve the bandpass response. For example, the transistors of MN1-MN4 can be sized such that parasitic capacitance of the switch 316 (which can include the gate-drain capacitance (Cgd) of MN1 and the combined gate capacitances of MN1-MN4) can form the resonator 334 with the inductor 308b (and the capacitor 314), and the resonator 334 has a resonant frequency within a frequency band of 5 GHz to 7 GHZ. The transistors of MN5-MN8 can also be sized such that parasitic capacitance of the switch 320 (which can include the gate-drain capacitance (Cgd) of MN5 and the combined gate capacitances of MN5-MN8) can form the resonator 336 with the inductor 308c (and the capacitor 318), and the resonator 336 has a resonant frequency within a frequency band of 5 GHz to 7 GHz.

Also, the stacked transistors of each of the switches 316 and 320 can improve the linearity of the signal by reducing the turning on of the transistors in the switch when the switch is in the off-state. Specifically, if the switch 316 (or 320) includes a single transistor coupled between the signal terminals (e.g., the terminals 304a and 304b, and the terminals 306a and 306b), the signal voltage between the terminals can set the maximum drain-source voltage of the single transistor. The drain voltage can be coupled to the gate via parasitic drain-gate capacitance between the drain and the gate to generate a coupled gate voltage. Although the switch 316 is in the off-state, for certain signal voltage, the drain voltage of the single transistor can be high enough that the coupled gate voltage can turn on the transistor and change the Ron of the enabled connection. The turning on of the transistor can depend on the amplitude of the signal, which introduces non-linearity to the signal. On the other hand, by having stacked transistors coupled between the signal terminals, each transistor in the stack can divide up the signal voltage and each can have a reduced drain-source voltage. Accordingly, even if the drain voltage of a particular transistor in the stack couples to the gate to generate a coupled gate voltage, that coupled gate voltage may not be high enough to turn on the transistors. Such arrangements can reduce the inadvertent turning on of the transistors of the switch across a wide signal voltage range and improve linearity.

Figure 5:
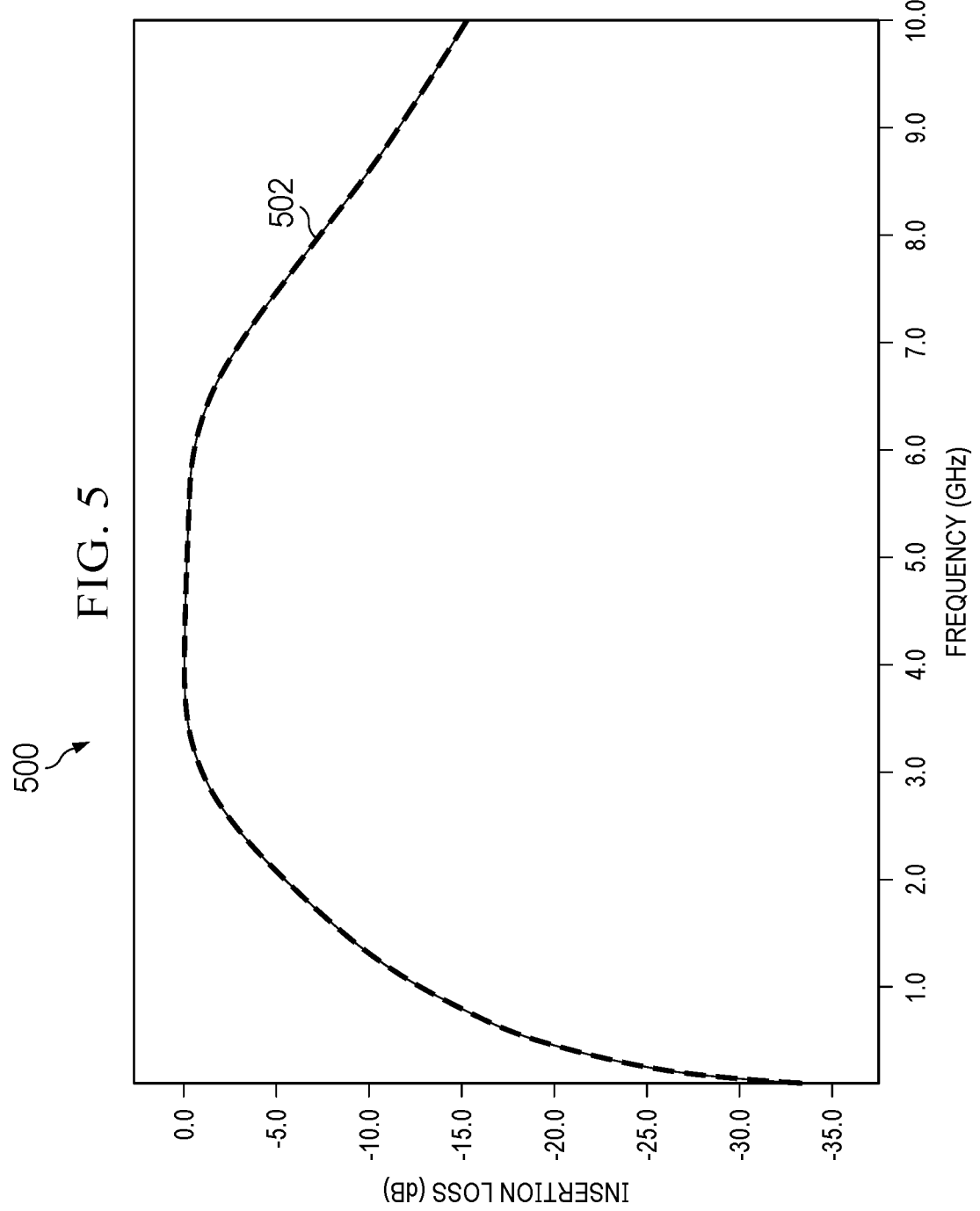
FIG. 5 is a graph of an example frequency response of the example multi-terminal switches of FIGS. 1 and 2.

FIG. 5 shows a graph 500 of an example frequency response of the multi-terminal switch 102. The horizontal axis represents frequency in GHz, and the vertical axis represents insertion loss in dB. A frequency response curve 502 shows the insertion loss of the multi-terminal switch 102, which is nearly zero dB in a frequency band from 3 GHz to 6.5 GHZ. In some examples, the multi-terminal switch 102 as shown in FIG. 4, using FETS with RonCoff greater than 300 femtoseconds (fs) to form the switches 316 and 320, can have an insertion loss of less than 0.7 dB and a P1 dB greater than 37 dBm.

Figure 6:
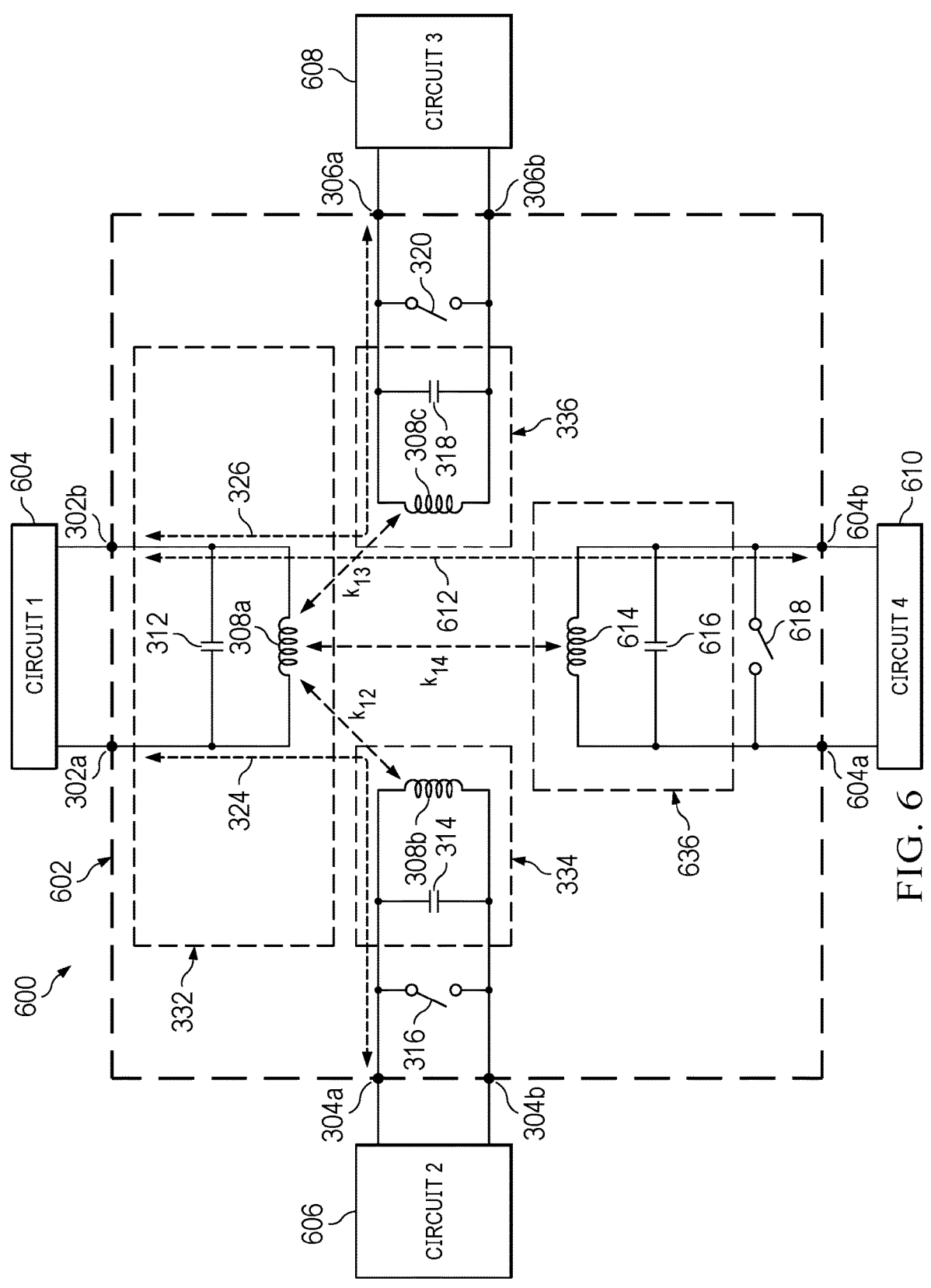
FIG. 6 is a schematic of a system including an example multi-terminal switch.

FIG. 6 is a schematic of a system 600 including an example multi-terminal switch 602. Example switch 602 includes the terminals 302a/b, 304a/b, and 306a/b. The switch 602 also includes the inductor 308a and the capacitor 312 coupled between the terminals 302a and 302b, the inductor 308b, the capacitor 314, and the switch 316 coupled between the terminals 304a and 304b, and the inductor 308c, the capacitor 318, and the switch 320 coupled between terminals 306a and 306b. The terminals 302a/b can be coupled to a circuit 604 (e.g., the antenna 104), the terminals 304a/b can be coupled to a circuit 606 (e.g., the transmitter side 106), and the terminals 306a/b can be coupled to a circuit 608 (e.g., the receiver side 108). Also, the switch 602 includes terminals 604a and 604b coupled to a circuit 610. The switch 602 also includes an inductor 614 and a switch 618 coupled between the terminals 604a and 604b. In some examples, the switch 602 may include a capacitor 616 coupled between the terminals 604a and 604b. The inductor 614 and the capacitor 616 (and the off-capacitance of switch 618) can form a resonator 636 to provide a particular bandpass response over a particular frequency range, as described above.

The switch 602 can be controlled to provide a connection between the terminals 302*a/b* and one of the terminals 304*a/b*, the terminals 306*a*/306*b*, or the terminals 604*a*/604*b*. In some examples, the switch 602 can be configured as a single pole triple throw switch. In such examples, the terminals 302*a/b* and the resonator 332 can be a pole. The terminals 304*a/b*, the switch 316, and the resonator 334 can a first throw. The terminals 306*a/b*, the switch 320, and the resonator 336 can be a second throw. The terminals 604*a/b*, the switch 618, and the resonator 636 can be a third throw.

Specifically, to enable the connection 324 between the terminals 302*a/b* and the terminals 304*a/b*, the switch 316 can be opened, and the switches 318 and 618 can be closed. Also, to enable the connection 326 between the terminals 302*a/b* and the terminals 306*a/b*, the switch 320 can be opened, and the switches 316 and 618 can be closed. Further, to enable a connection 612 between the terminals 302*a/b* and the terminals 604*a/b*, the switch 618 can be opened, and the switches 316 and 320 can be closed. A third signal can be transmitted between the terminals 302*a/b* and the terminals 604*a/b* via a magnetic coupling between the inductors 308*a* and 614 with a magnetic coupling coefficient of $k_{14}$.

Figure 7:
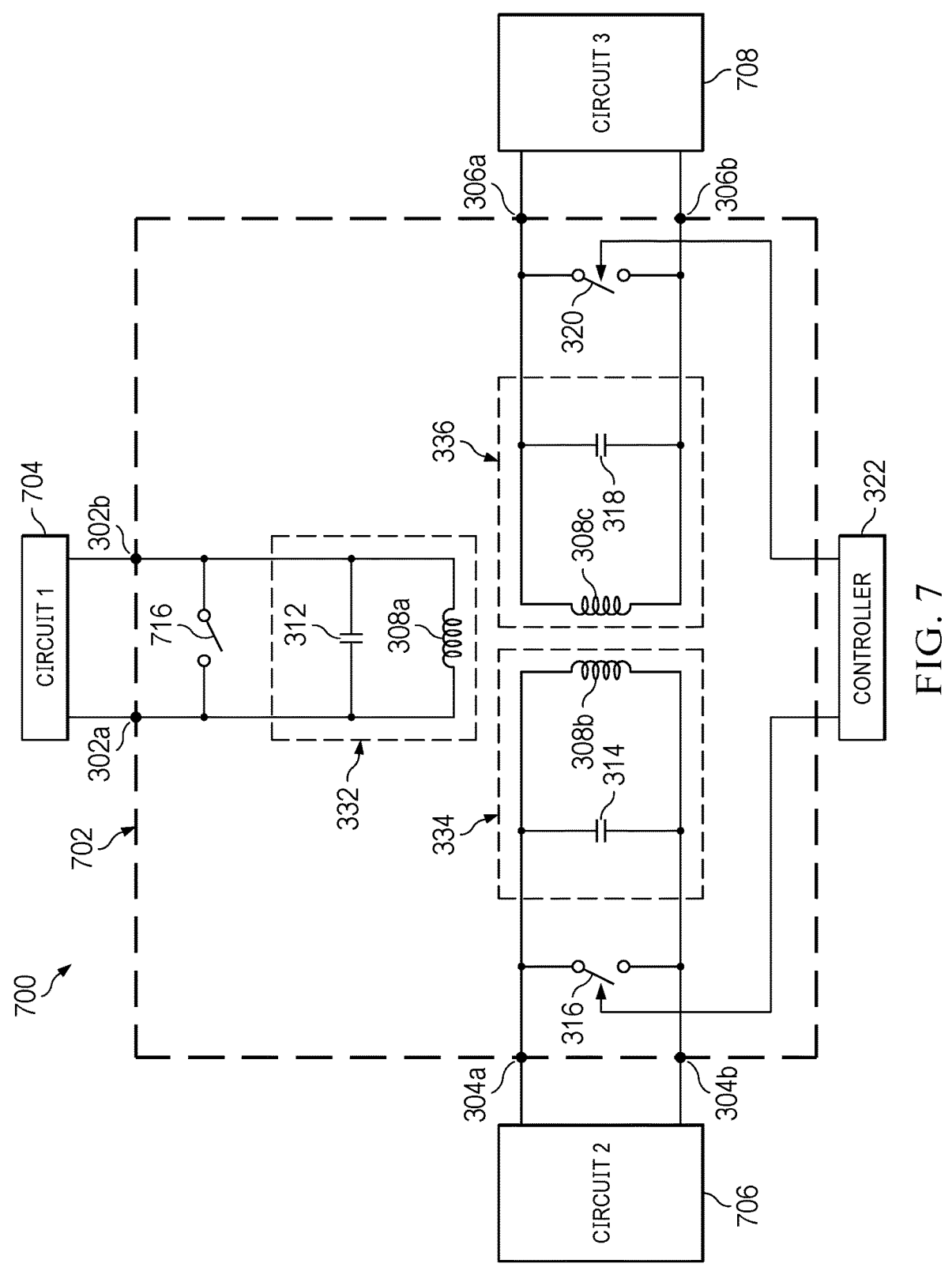
FIG. 7 is a schematic of a system including an example multi-terminal switch.

FIG. 7 is a schematic illustrating a system 700 including an example multi-terminal switch 702. Example switch 702 includes the terminals 302*a/b*, 304*a/b*, and 306*a/b*. The switch 702 also includes the inductor 308*a*, the capacitor 312, and a switch 716 coupled between the terminals 302*a* and 302*b*, the inductor 308*b*, the capacitor 314, and the switch 316 coupled between the terminals 304*a* and 304*b*, and the inductor 308*c*, the capacitor 318, and the switch 320 coupled between the terminals 306*a* and 306*b*. The terminals 302*a/b* can be coupled to a circuit 704, the terminals 304*a/b* can be coupled to a circuit 706, and the terminals 306*a/b* can be coupled to a circuit 708. In some examples, the multi-terminal switch 702 can be a multiway switch.

The switch 702 can be controlled to enable a connection between one of the terminals 302*a/b*, 304*a/b* and 306*a/b* to another one of those terminals. For example, to enable a connection between 302*a/b* and 304*a/b*, the switches 716 and 316 can be opened, and the switch 320 can be closed. Also, to enable a connection between the terminals 302*a/b* and 306*a/b*, the switches 716 and 320 can be opened, and the switch 316 can be closed. Further, to enable a connection between the terminals 304*a/b* and 306*a/b*, the switches 316 and 320 can be opened, and the switch 716 can be closed.

FIG. 8 is a schematic of an equivalent circuit model 800 of a connection provided by the multi-terminal switch 102, with the switch 316 open and the switch 320 closed. The resonator 334 is enabled, and the resonator 336 (not shown in FIG. 8) is disabled.

Although the resonator 336 is disabled, it may provide an indirect connection between the inductors 308*a* and 308*b*. Specifically, the signal transmitted by the antenna 104 may couple to the resonator 336 via magnetic coupling between the inductors 308*a* and 308*c*. Due to the low impedance between the terminals 306*a/b* (e.g., less than 5 ohms), the coupled signal may be reflected back to the resonator 332 (via magnetic coupling between the inductors 308*c* and 308*a*) and to the resonator 334 (via magnetic coupling between the inductors 308*c* and 308*a*). In this case, transfer of magnetic energy from the inductor 308*a* can be mostly or entirely to the inductor 308*b*, and because the voltage between the terminals 306*a* and 306*b* is zero, the receiver side 108 does not receive a signal. Also, currents flowing in the inductor 308*a* and the inductor 308*b* respectively induce magnetic fluxes that induce a current in the inductor 308*c*, and the current in the inductor 308*c* forms a magnetic flux that subtracts from the magnetic fluxes respectively generated by the inductor 308*a* and the inductor 308*b*. All these provide an indirect connection between the inductor 308*a* and the inductor 308*b* through the resonator 336.

A summation of these effects on the connection between the terminals 302*a/b* and the terminals 304*a/b* is represented in the equivalent model 800 by effective inductances for the inductor 308*a* and the inductor 308*b*, as well as by an effective coupling coefficient. The equivalent model 800 can include a doubly-tuned transformer. The inductors 308*a*, 308*b*, and 308*c* can have respective inductances of L1, L2, and L3. When the resonator 336 is shorted, an effective inductance of the inductor 308*a* reduces from L1 to $$L1 \times (1 - k_{13}^2),$$

and an effective inductance of the inductor 308*b* reduces from L2 to $$L2 \times (1 - k_{23}^2).$$

Also, the effective coupling coefficient is determined as follows. There are two connections between the transmitter side 106 and the antenna 104. In a first connection, a signal from the transmitter side 106 can directly couple to the antenna 104. This first connection contributes a portion of the effective coupling coefficient corresponding to $k_{12}$ in the numerator. In a second connection, the signal from the transmitter side 106 couples/leaks to the receiver side 108, reflects from the short caused by the closed switch 320, and the reflected signal propagates to the antenna 104. This indirect connection contributes a portion of the effective coupling coefficient corresponding to $-k_{23} \times k_{13}$ in the numerator. Accordingly, the coupling coefficient between the inductors 308*a* and 308*b*, with the resonator 334 enabled and the resonator 336 disabled, is given by Equation 1:

$$\frac{k_{12} - k_{23} \times k_{13}}{\sqrt{(1 - k_{13}^2) \times (1 - k_{23}^2)}} \qquad \text{Equation 1}$$

Figure 9:
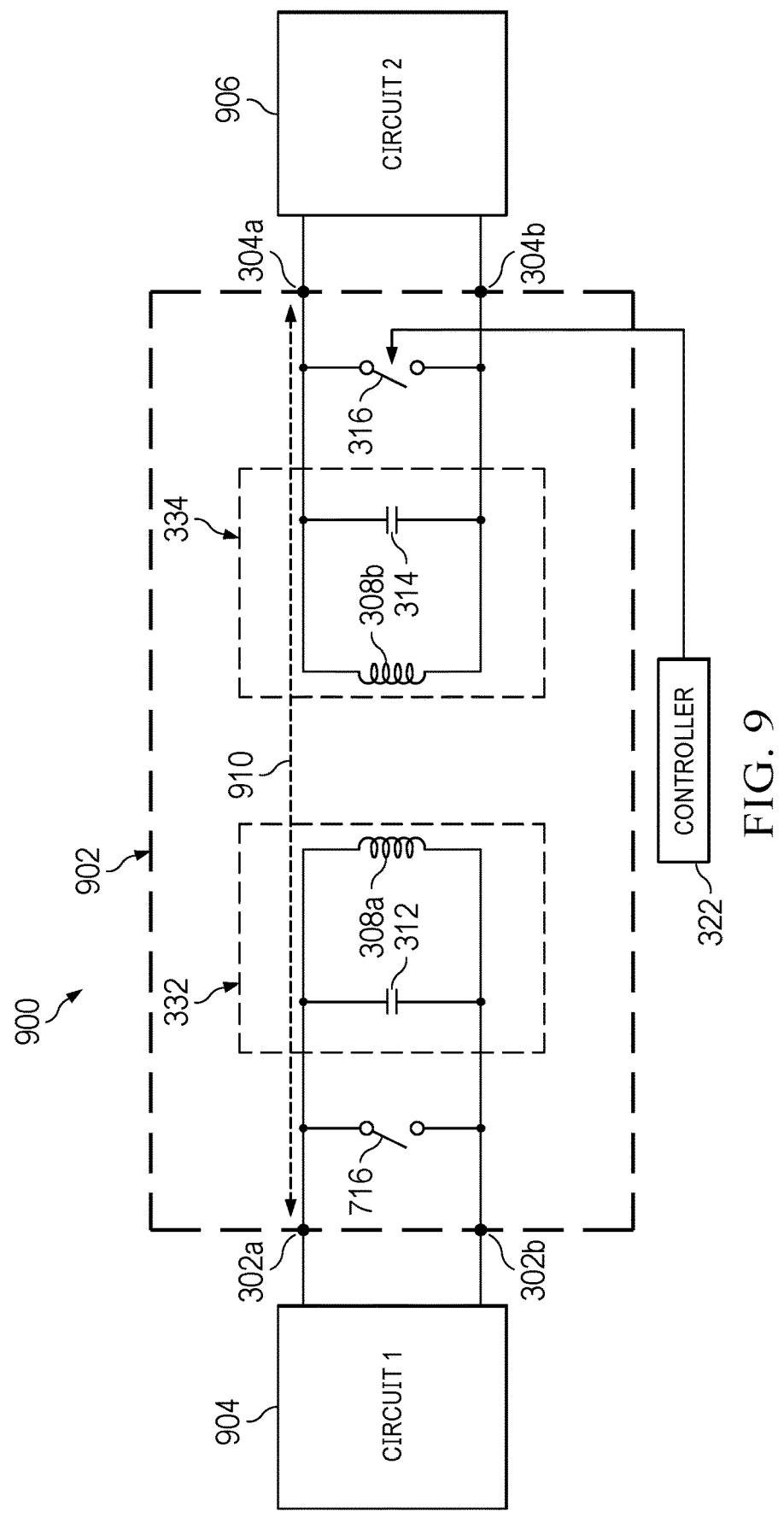
FIG. 9 is a schematic of a system including an example multi-terminal switch.

FIG. 9 is a schematic of a system 900 including an example switch 902. Example switch 902 includes the terminals 302*a/b* and 304*a/b*. The switch 902 includes the inductor 308*a* and the capacitor 312 coupled between the terminals 302*a* and 302*b* forming the resonator 332. Also, the switch 902 includes the inductor 308*b*, the capacitor 314, and the switch 316 coupled between the terminals 304*a* and 304*b*. In some examples, the switch 902 can be a single pole single throw switch. The terminals 302*a/b* can be coupled to a circuit 804 (e.g., the antenna 104), and the terminals 304*a/b* can be coupled to a circuit 806 (e.g., the transmitter side 106 or the receiver side 108). The switch 902 can be controlled to enable or disable a connection 910 between the terminals 302*a/b* and the terminals 304*a/b*. To enable the connection, the switch 316 can be opened, and to disable the connection, the switch 316 can be closed. In some examples, the switch 902 can be a single pole single throw (SPST) switch where the terminals 302*a/b* and the resonator 332 can be a pole and the terminals 304*a/b* and the resonator 334 can be a throw.

In some examples, switch 902 can include the switch 716 coupled between terminals 302a and 302b. In such example, in one operation mode, the switch 316 can be opened, and the switch 716 can be opened or closed to enable or disable the connection 910. Also, in another operation mode, the switch 716 can be opened, and the switch 316 can be opened or closed to enable or disable the connection 910.

The following are additional examples of switches (e.g., the switches 102, 702 and 902) and their operations.

In some examples, the multi-terminal switch 102 is used in a circuit other than a transceiver.

In some examples, the switches to short-circuit the resonators can include SPST switches.

In some examples, the switches to short-circuit the resonators are formed using components other than transistors.

In some examples, capacitive elements other than capacitors are used.

In some examples, transistors other than MOSFETS are used.

In some examples, inductive elements other than wire coils are used.

In some examples, the controller 322 signals the switch 316 to open prior to signaling the switch 320 to close, and signals the switch 320 to open prior to signaling the switch 316 to close. In some examples, the controller 322 signals the switch 316 to open contemporaneously with signaling the switch 320 to close, and signals the switch 320 to open contemporaneously with signaling the switch 316 to close.

In some examples, such as in a symmetric switch in which insertion loss is the same with respect to both signals from the transmitter side 106 to the antenna 104, and signals from the antenna 104 to the receiver side 108, C2 and C3 are equal. In some examples, such as in an asymmetric switch in which insertion loss is different with respect to signals from the transmitter side 106 to the antenna 104, and signals from the antenna 104 to the receiver side 108, C2 and C3 are different.

In some examples, as in a symmetric switch in which insertion loss is the same with respect to both signals from the transmitter side 106 to the antenna 104, and signals from the antenna 104 to the receiver side 108, the coupling coefficient $k_{12}$ between the inductor 308a and the inductor 308b equals the coupling coefficient $k_{13}$ between the inductors 308a and 308c. In some examples, such as in an asymmetric switch in which insertion loss is different with respect to signals from the transmitter side 106 to the antenna 104, and signals from the antenna 104 to the receiver side 108, the coupling coefficient $k_{12}$ between the inductor 308a and the inductor 308b does not equal the coupling coefficient $k_{13}$ between the inductor 308a and the inductor 308c.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described herein as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

Certain components may be described herein as being of a particular process technology, but these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor.

Uses of the phrase "ground voltage potential" in this description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described examples, and other examples are possible, within the scope of the claims.

What is claimed is:

1. An apparatus comprising:

a first switch coupled between first terminals;

a first inductor coupled between the first terminals;

a second switch coupled between second terminals;

a second inductor coupled between the second terminals; and a third inductor coupled between third terminals, in which the first terminals, second terminals, and the third terminals are direct current (DC) isolated from each other, and the apparatus configurable to:

in a first mode, open the first switch and close the second switch, in which the opening of the first switch and the closing of the second switch enables a first connection between the first terminals and the third terminals via a first magnetic coupling between the first and third inductors; and in a second mode, close the first switch and open the second switch, in which the closing of the first switch and opening of the second switch enables a second connection between the second terminals and the third terminals via a second magnetic coupling between the second and third inductors.

2. The apparatus of claim 1, further comprising:
a first capacitor coupled between the first terminals;
a second capacitor coupled between the second terminals; and
a third capacitor coupled between the third terminals.

3. The apparatus of claim 2, wherein:
the first capacitor and the first inductor are part of a first resonator configured to have a first resonant frequency;
the second capacitor and the second inductor are part of a second resonator configured to have a second resonant frequency; and
the third capacitor and the second inductor are part of a third resonator configured to have a third resonant frequency.

4. The apparatus of claim 3, wherein:
the first inductor has a first inductance, the first capacitor has a first capacitance, and the first inductance and the first capacitance are based on the first resonant frequency;
the second inductor has a second inductance, the second capacitor has a second capacitance, and the second inductance and the second capacitance are based on the second resonant frequency; and
the third inductor has a third inductance, the third capacitor has a third capacitance, and the third inductance and the third capacitance are based on the third resonant frequency.

5. The apparatus of claim 4, wherein:
the first inductance is a first effective inductance based on a first magnetic coupling coefficient between the first and third inductors;
the second inductance is a second effective inductance based on a second magnetic coupling coefficient between the second and third inductors; and
the third inductance is a third effective inductance based on a third magnetic coupling coefficient between the first and second inductors and one of the first or second magnetic coupling coefficients.

6. The apparatus of claim 4, wherein:
the first switch includes a first transistor, in which a first dimension of the first transistor is based on: the first resonant frequency; the first inductance; and the first capacitance; and
the second switch includes a second transistor, in which a second dimension of the second transistor is based on: the second resonant frequency; the second inductance; and the second capacitance.

7. The apparatus of claim 6, wherein each of the first and second transistors includes stacked transistors.

8. The apparatus of claim 2, wherein each of first, second, and third capacitors includes a respective tunable element.

9. The apparatus of claim 1, wherein the first, second, and third inductors are part of a transformer.

10. The apparatus of claim 1, further comprising a third switch coupled between the third terminals, wherein the apparatus is configured to:
in the first and second modes, open the third switch; and
in a third mode, open the first and second switches and close the third switch, in which the opening of the first and second switches and the closing of the third switch enables a third connection between the first terminals and the second terminals via a third magnetic coupling between the first and second inductors.

11. The apparatus of claim 1, wherein the first and second switches and the first, second, and third inductors are part of a single pole double throw switch.

12. The apparatus of claim 1, further comprising:
a third switch coupled between fourth terminals;
a fourth inductor coupled between the second terminals, and
wherein the apparatus is configured to:
in the first and second modes, close the third switch; and
in a third mode, close the first and second switches and open the third switch, in which the closing of the first and second switches and the opening of the third switch enables a third connection between the third terminals and the fourth terminals via a third magnetic coupling between the third and fourth inductors.

13. The apparatus of claim 12, wherein the first, second, and third switches and the first, second, third, and fourth inductors are part of a single pole triple throw switch.

14. A transceiver system comprising:
a multi-terminal switch having first terminals, second terminals, third terminals, and a control input, the first terminals, the second terminals, and the third terminals being DC-isolated from each other, and the multi-terminal switch including:
a first switch coupled between the first terminals, the first switch having a first control terminal coupled to the control input;
a first inductor coupled between the first terminals;
a second switch coupled between second terminals, the second switch having a second control terminal coupled to the control input;
a second inductor coupled between the second terminals; and
a third inductor coupled between the third terminals,
a transmitter having transmitter terminals coupled to the first terminals;
a receiver having receiver terminals coupled to the second terminals;
an antenna having antenna terminals coupled to the third terminals; and
a controller having a control output coupled to the control input.

15. The transceiver system of claim 14, wherein the controller is configured to set the control output to a first state in a first mode and set the control output to a second state in a second mode;
wherein the first switch is opened and the second switch is closed responsive to the control output having the first state, and the opening of the first switch and the closing of the second switch enables a first connection between the antenna and the transmitter via a first magnetic coupling between the first and third inductors; and
wherein the first switch is closed and the second switch is opened responsive to the control output having the second state, and the closing of the first switch and the opening of the second switch enables a second connection between the antenna and the receiver via a second magnetic coupling between the second and third inductors.

16. The transceiver system of claim 14, further comprising:

a first capacitor coupled between the first terminals;
  a second capacitor coupled between the second terminals; and
  a third capacitor coupled between the third terminals.

17. The transceiver system of claim 16, wherein:

the first capacitor and the first inductor are part of a first resonator configured to have a first resonant frequency;
  the second capacitor and the second inductor are part of a second resonator configured to have a second resonant frequency; and
  the third capacitor and the second inductor are part of a third resonator configured to have a third resonant frequency.

18. The transceiver system of claim 14, wherein each of the first and second switches includes stacked transistors.

19. The transceiver system of claim 14, wherein the first, second, and third inductors are part of a transformer.

20. An apparatus comprising:

an antenna coupled between first terminals;
a first inductor coupled between the first terminals;
a transmitter coupled between second terminals, the second terminals being DC isolated from the first terminals;
a switch coupled between the second terminals; and
a second inductor coupled between the second terminals,
the apparatus configured to:

in a first mode, open the switch, in which the opening of the switch enables a connection between the transmitter and the antenna via a magnetic coupling between the first and second inductors; and
  in a second mode, close the switch, in which the closing of the switch disconnect between the antenna and the transmitter.

21. The apparatus of claim 20, wherein the switch is a first switch, and the apparatus further includes a second switch coupled between the first terminals.

\*    \*    \*    \*    \*